Sept. 27, 1960 G. L. MATTHAEI 2,954,468

MICROWAVE FILTER AND DETECTOR

Filed March 25, 1958

GEORGE L. MATTHAEI
INVENTOR.

BY Jerry G. Dimondo, agent
Morris Spector
ATTORNEY 2,954,468

MICROWAVE FILTER AND DETECTOR

George L. Matthaei, Inglewood, Calif., assignor, by mesne assignments, to Thompson Ramo Wooldridge Inc., Cleveland, Ohio, a corporation of Ohio Filed Mar. 25, 1958, Ser. No. 723,769

14 Claims. (Cl. 250—31)

This invention relates to microwave apparatus utilizing band-pass filters, and in particular to apparatus requiring the use of a microwave band-pass filter in conjunction with a unilateral conduction device, such as a crystal diode.

One important application for the use of a microwave band-pass filter in combination with a crystal diode is in wide-band "crystal-video" microwave receivers. In such a receiver, incoming video modulated microwave signals are first sent through a band-pass filter to eliminate any microwave signals outside the band of interest. The filtered microwave signals are then fed to a crystal diode detector so as to demodulate the microwave signals and to produce an output signal corresponding to the original video modulating signals, after which the video signals are amplified.

In addition to eliminating unwanted microwave signals, it is desirable that the microwave filter provide a direct-current path required for the proper operation of the crystal diode. Also, it is desirable, for frequencies within the filter pass band, that the filter be capable of presenting impedances to the crystal diode such as will enhance the crystal detector performance.

In general, crystal diode mounts and band-pass filters for crystal video applications are designed separately. Generally, the crystal diode mount requires a number of impedance matching elements in order to work reasonably well with the filter. This results in an unnecessarily complex and bulky structure.

Accordingly, it is an object of this invention to combine a microwave band-pass filter and a crystal diode in a simple, compact structure in which the diode and filter can readily be designed to work well together.

Another important application for the use of a microwave band-pass filter in combination with a crystal diode is in wide band mixers of the type where a band of signals in a given portion of the microwave spectrum is to be translated to another portion of the microwave spectrum. In this case, the band of signals to be translated and the signal from a local oscillator are together applied to a crystal diode to create sum, difference, and various combinations of harmonic frequency components. These mixing components are then sent through a band-pass filter which passes the frequency components which are desired and rejects the numerous components which are not desired.

In the mixer application, it is also desirable that the filter provide a direct-current connection for the crystal diode. Furthermore, it is desirable that the filter present very low impedance to the crystal diode in the frequency ranges of the input signals and local oscillator signal, since the crystal diode is essentially in series with the filter and any filter input impedance will add to the impedance of the crystal diode. Extra impedances of this sort could make it quite difficult to get good energy transfer into the crystal diode. However, for frequencies within the pass band of the filter, the crystal diode itself is acting as a generator, and for maximum power transfer into the filter it is desirable that the filter present an impedance to the crystal diode which is nominally the complex conjugate of the impedance seen looking into the crystal diode from its output side.

As far as is known, there is no commercial product available which can satisfy the requirements above mentioned in a design which is as simple and compact as might be desired.

Accordingly, it is a further object of this invention to combine a microwave band-pass filter and a crystal diode into a simple compact unit which is susceptible of easy manufacture and which can be designed to fulfill all the requirements mentioned above.

The foregoing and other objects are achieved in accordance with certain embodiments of this invention by utilizing a resonator element of a strip transmission line filter as a mounting element for a unilateral conduction device, such as a crystal diode. The resonator crystal mount element is designed to be substantially quarter-wave length long at the mid band frequency of the filter. It is provided either with a shunt inductive discontinuity or inductor, or a shunt capacitive discontinuity or capacitor at the end next to the crystal, depending on its intended use. The shunt inductor is realized by either a single or double short-circuited stub arrangement, and the shunt capacitor is realized by two layers of dielectric material between metal blocks.

Figures 1, 2:
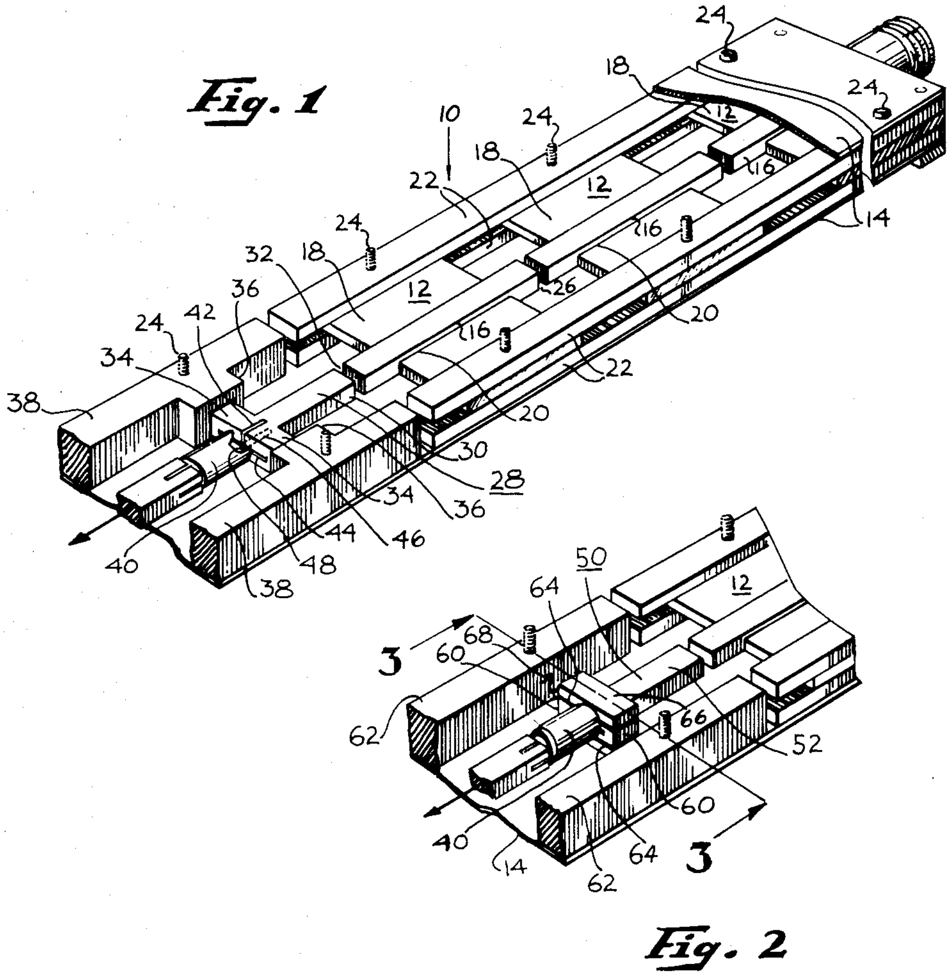
Figure 1 is a perspective view of one embodiment of the invention in which a combined filter and crystal mount is provided with a shunt inductive discontinuity at the crystal.
Figure 2 is a perspective view of another embodiment of the invention in which a shunt capacitive discontinuity is provided at the crystal.

Figure 1 shows a microwave band-pass filter 10 of the strip transmission line type, including a series of resonator assemblies 12 arranged symmetrically between a pair of elongated metal plates, or ground plane plates 14. Each of the resonator assemblies 12 is made up of a straight metal bar 16 supported on a relatively thin dielectric support plate 18. The bar 16 has a longitudinal slot 20 through which the dielectric support plate 18 extends to provide the support. The resonator bars 16 are spaced from the ground plane plates 14 by means of two pairs of long brackets 22 which clamp the edges of the dielectric support plates 18. The ground plane plates 14, brackets 22 and resonator assemblies 12 are fastened together by bolts 24 to produce a rigid structure.

In the embodiment shown, the resonator bars 16 are designed to be slightly less than a half-wave length long at the mid-band frequency of the filter 10, and are capacitively coupled together by small gaps 26 therebetween. Such an arrangement produces an array of substantially half-wavelength resonators provided at their ends with series capacitance discontinuities.

In accordance with the invention, the filter 10 terminates at one end with a resonator and crystal mount element 28. The element 28 generally is less than but substantially a quarter-wavelength long at the mid-band frequency of the filter. However, it may be considerably less than one-quarter-wavelength in relatively wide band filters. For instance, it may be of the order of one-eighth-wavelength for filters of 20% bandwidth. The element 28 may comprise a T-shaped metal bar, as shown, with its main body portion 30 closely spaced by a gap 32 from the last half-wavelength resonator bar 16 of the filter 10 shown, by way of example, to provide capacitive coupling therebetween. To provide support for the T-shaped element 28, the two arms or short-circuited stubs 34 of the T have their ends joined with or fitting into projections 36 formed in a pair of metal spacers 38. Alternatively, the resonator element 28 may be formed by photoetching copper foil attached to a dielectric support sheet. The spacers 38, which are lined up with the brackets or clamping bars 22, have a thickness equal to the combined thickness of the brackets or clamping bars 22 and dielectric plates 18 to maintain the same spacing between ground plane plates 14.

The T-shaped resonator element 28, with its arms or stubs 34 serving as shunt inductors or inductive discontinuities, is not only an integral part of the filter 10 but has the dual function of providing a mount for a unilateral conduction device, or crystal diode 40. For this purpose the top of the T has two crossed slots 42 and 44 formed therein and crossing at a central hole 46 so as to provide a spring clamp for one of the mounting pins 48 of the crystal diode 40.

When the crystal diode 40 is mounted on the T-shaped element 28 as shown, the resulting compact unit is well suited for use in crystal-video circuits as well as some mixer circuits. The T-shaped element 28 provides a ground return for the diode 40 by means of conductive connections afforded by the metal stubs 34 and spacers 38 between the diode pin 48 and the ground plane plates 14. The T-shaped element 28 can be designed to provide the correct impedance match between the filter 10 and the diode circuits for frequencies within the pass band of the filter 10. As required for optimum efficiency in mixer applications where it is desired to translate a wide band of signals from one portion of the microwave spectrum to another portion of the microwave spectrum, the resonant element 28 can readily be designed so as to present a low impedance to the diode 40 in the stop band and to present to the diode 40, for frequencies within the filter pass band, an impedance that is substantially the complex conjugate of the impedance presented to the resonator 28 by the diode 40. By complex conjugate is meant having an equal resistive component and a reactive component which is equal and opposite in sign.

In some circumstances, such as for instance for filters with relatively large percentage bandwidth, say 20% bandwidth centered at 3000 megacycles, it is desirable to use only one arm or stub 34 on the quarter-wave resonator element 28. In this case the resonator element 28 would have an L-shape instead of a T-shape as shown.

In an alternative structure, the resonator element 28 may be supported by dielectric slabs having planes either perpendicular to or parallel with the ground plane plates. However, such structures would tend to have rather high dielectric losses and are not preferred.

The resonator and crystal mount embodiment thus far described is useful in mixer applications where it is desired to translate a wide band of relatively low microwave frequency signals up to a higher microwave frequency band. However, for translating a band of relatively high microwave signals to a lower band, the device of Figure 1 may not be suitable, if the input signals are much above the pass band frequencies of the filter 10. Under such circumstances, the inductor stubs 34 will present a relatively high impedance to the diode 40 at the frequencies of the input signals and thus reduce energy transfer to the diode 40. This condition may be obviated by modifying the design of the quarter-wavelength resonator element in the manner to be described, so as to insure that the filter presents a very low impedance to the diode 40 at the incoming frequencies.

Figure 3:
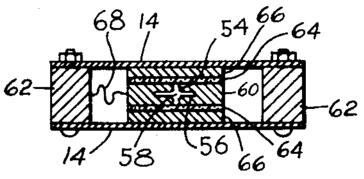
Figure 3 is a sectional view taken along line 3—3 of Figure 2.

In the embodiment shown in Figures 2 and 3, a quarter-wavelength resonator element 50 is designed with a capacitive shunt discontinuity next to the diode 40 instead of an inductive shunt discontinuity. Otherwise, the filter components remain substantially the same.

Referring to Figures 2 and 3, the resonator element 50 is again substantially a quarter-wavelength long but might be slightly longer than a quarter-wavelength. It may consist in part of a T-shaped conductive portion 52 having crossed slots 54 and 56 and a hole 58 in its top in which to mount the diode 40. The arms 60 of the T, in this case, however, are spaced from two metal spacers 62 rather than being attached thereto. In addition, across the top and bottom sides of the arms 60 of the T are mounted two dielectric spacers 64 and two metal blocks 66. The two blocks 66, dielectric spacers 64, and the arms 60 of the T so combined constitute a shunt capacitor at the end of the resonator element 50.

The two metal blocks 66, which may be soldered to the ground plane plates 14, and the dielectric spacers 64 serve also as supports for the resonator element 50 and space the T-shaped conductive portion 52 from the ground plane plates 14. A piece of fine iron wire 68 is connected between the T-shaped conductive portion 52 and one of the metal spacers 62 to provide a direct-current return for the diode 40. By using iron, which is relatively lossy, and by making the wire 68 very fine, the direct current return has negligible effect in the operation of the shunt capacitor at microwave frequencies.

While the invention has been illustrated and described as embodied in filters designed with half-wavelength resonator elements, it may be used in conjunction with filter elements having a different wavelength, for example, quarter-wavelength. In this connection, one may use quarter-wavelength filters of the kind disclosed in my concurrently-filed application entitled "Microwave Filter," Serial No. 723,770, filed March 25, 1958, without changing the quarter-wavelength resonator-crystal mounts of the present invention.

It is now apparent that the invention combines a microwave band-pass filter and a crystal diode into a single compact unit which is simple in design, can easily be manufactured, and is readily designed to provide proper impedance matching between the filter and diode circuits.

What is claimed is:

1. A microwave device comprising a band pass filter having a predetermined mid-band frequency and including at least one resonator element having a center conductor, a lumped capacitance at one end of and in series with said conductor, a lumped reactance at the other end of and in shunt with said conductor, said reactance being spaced along said conductor from said capacitance a distance which is substantially one-eighth to one-quarter wavelength at said mid-band frequency, and a unilateral conduction device mounted directly on said other end of said conductor.

2. A microwave device as in claim 1 wherein said shunt reactance comprises an inductance.

3. A microwave device as in claim 1 wherein said shunt reactance comprises a capacitance.

4. A microwave device comprising a pair of spaced apart parallel ground plane plates, first and second elongated conductors disposed between said plates, a series capacitance coupling one end of said first conductor to one end of said second conductor and forming with said conductors part of a band-pass filter having a predetermined mid-band frequency, a crystal diode mounted on the other end of said first conductor, and at least one relatively short conductive stub coupled between said other end of said first conductor and at least one of said plates, said first conductor being substantially one-eighth to one-quarter wavelength long at said mid-band frequency.

5. A microwave device comprising a strip transmission line band-pass filter having a predetermined mid-band frequency and including a pair of spaced apart ground plane plates, a center conductor extending between and parallel to said plates, a lumped capacitance at one end of and in series with said conductor, a conductive stub at the other end of said conductor and shunting said conductor to said plates, and a crystal diode mounted directly on said other end of said conductor, said stub being spaced along said conductor from said capacitance a distance which is substantially one-eighth to one-quarter wavelength at said mid-band frequency.

6. A microwave device comprising a strip transmission line band pass filter having a predetermined mid-band frequency and including a pair of spaced apart ground plane plates, a center conductor extending between and parallel to said plates, a lumped capacitance at one end of and in series with said conductor, two conductive stubs extending oppositely from the other end of said conductor and connecting electrically said conductor to said plates, and a crystal diode mounted directly on said other end of said conductor, each of said stubs being spaced along said conductor from said capacitance a distance which is substantially one-eighth to one-quarter wavelength at said mid-band frequency, said crystal diode having a predetermined complex impedance relative to said conductor and said conductor being arranged to present to said crystal diode an impedance which is substantially equal to the complex conjugate of said predetermined impedance.

7. A microwave device comprising a strip transmission line band-pass filter having a predetermined mid-band frequency and including a pair of ground plane plates, a pair of parallel conductive members spacing said plates in parallel spaced apart relation, a flat center conductor extending between and parallel to said plates and having an arm projecting from one end thereof and joined electrically with one of said conductive members, a lumped capacitance at the other end of and in series with said conductor, and a crystal diode mounted directly on said one end of said conductor, said arm being spaced along said conductor from said capacitance a distance which is substantially one-eighth to one-quarter wavelength at said mid-band frequency.

8. A device as in claim 7, wherein said center conductor has two opposing arms each joined to one of said conductive members.

9. A microwave device comprising a strip transmission line band-pass filter having a predetermined mid-band frequency and including a pair of spaced apart ground plane plates, a center conductor extending between and parallel to said plates, a lumped capacitance at one end of and in series with said conductor, a relatively small lumped capacitance at the other end of and in shunt with said conductor, said last-mentioned capacitance including a metal block on one of said ground plane plates and a thin dielectric spacer between said block and said conductor, said shunt capacitance being spaced along said conductor from said series capacitance a distance which is substantially one-quarter wavelength at said mid-band frequency, wherein a unilateral conduction device having a predetermined complex impedance is mounted on and electrically connected to said other end, wherein said other end is arranged to present to said unilateral conduction device an impedance which is substantially equal to the complex conjugate of said predetermined impedance, and wherein said relatively small lumped capacitance is connected electrically to said ground plates to provide a unilateral current path for said unilateral conduction device.

10. A microwave filter device comprising a band pass filter resonator associated with predetermined frequency pass and stop bands and including a central conductor, a lumped capacitance at one end of and in series with said conductor, a lumped reactance at the other end of and in shunt with said conductor, said reactance being spaced along said conductor from said capacitance a distance which is substantially one-eighth to one-quarter wavelength at the mid-frequency of said pass band, and a unilateral conduction device mounted directly on and connected electrically to said other end of said conductor, said resonator matching said device to said predetermined pass and stop bands by presenting an impedance which is substantially equal to the complex conjugate of the impedance of said device.

11. A microwave filter device comprising: at least one elongated ground member; a first resonator element mounted adjacent to said ground member and including a first elongated conductor spaced apart from said ground member and oriented in the same direction as said ground member; a second resonator element mounted adjacent to said ground member and including a second elongated conductor spaced apart from said ground member and oriented in the same direction as said ground member; said second conductor having one end thereof capacitively coupled to one end of said first conductor; a conductive member secured to said ground member at a point perpendicular to the other end of said second conductor and being connected electrically to said second conductor; a unilateral conduction device mounted on and connected electrically to said other end of said second conductor; said unilateral conduction device having a predetermined complex impedance relative to said second conductor; said second conductor being provided with a lumped reactance at said other end whereby the impedance thereof is substantially the complex conjugate of the predetermined impedance presented by said unilateral conduction device.

12. A microwave filter device having a predetermined mid-band frequency and comprising; at least one elongated ground member; a first resonator element mounted adjacent to said ground member and including a first elongated conductor spaced apart from said ground member and oriented in the same direction as said ground member; a second resonator element mounted adjacent to said ground member and including a second elongated conductor spaced apart from said ground member and oriented in the same direction as said ground member; said second conductor having one end thereof capacitively coupled to one end of said first conductor; a conductive member secured to said ground member at a point perpendicular to the other end of said second conductor and being connected electrically between said other end and said ground member; a unilateral conduction device mounted on and electrically connected to said other end of said second conductor; said unilateral conduction device having a predetermined complex impedance relative to said second conductor; said second conductor being provided with a lumped reactance at said other end whereby the impedance thereof is substantially the complex conjugate of the predetermined impedance presented by the unilateral conduction device, said reactance being spaced along said second conductor from said one end thereof a distance which is substantially one-eighth to one-quarter wavelength of the mid-band frequency.

13. A microwave filter device having a predetermined mid-band frequency and a band pass of at least about 10% of the mid-band frequency, comprising: at least one elongated ground member; a first resonator element mounted adjacent to said ground member and including a first elongated conductor spaced apart from said ground member and oriented in the same direction as said ground member; a second resonator element mounted adjacent to said ground member and including a second elongated conductor spaced apart from said ground member and oriented in the same direction as said ground member; a third resonator element mounted adjacent to said ground member and including a third elongated conductor spaced apart from said ground member and oriented in the same direction as said ground member; said second conductor having one end thereof capacitively coupled to one end of said first conductor; said third conductor having one end thereof capacitively coupled to the other end of said second conductor; a conductive member secured to said ground member at a point perpendicular to the other end of said third conductor and being connected electrically to said third conductor; a unilateral conduction device mounted on and connected electrically to said other end of said third conductor; said unilateral conduction device having a predetermined complex impedance relative to said third conductor; said third conductor being provided with a lumped reactance at said other end thereof whereby the impedance thereof is substantially the complex conjugate of the predetermined impedance presented by said unilateral conduction device.

14. A microwave filter device having a predetermined mid-band frequency and a band pass of at least about 10% of the mid-band frequency, comprising: a pair of elongated ground members; a first resonator element mounted between said ground members and including a first elongated conductor spaced apart from said ground members and oriented in the same direction as said ground members; a second resonator element mounted between said ground members and including a second elongated conductor spaced apart from said ground members and oriented in the same direction as said ground members; a third resonator element mounted between said ground members and including a third elongated conductor spaced apart from said ground members and oriented in the same direction as said ground members; said second conductor having one end thereof capacitively coupled to one end of said first conductor; said third conductor having one end thereof capacitively coupled to the other end of said second conductor; a conductive member secured between said ground members at a point perpendicular to the other end of said third conductor and being connected electrically between said other end and said ground members; a unilateral conduction device mounted on and electrically connected to said other end of said third conductor; said unilateral conduction device having a predetermined complex impedance relative to said third conductor; said third conductor being provided with a lumped reactance at said other end whereby the impedance thereof is substantially the complex conjugate of the predetermined impedance presented by the unilateral conduction device, said lumped reactance being spaced along said third conductor from said one end thereof a distance which is substantially one-eighth to one-quarter wavelength of the mid-band frequency.

References Cited in the file of this patent

UNITED STATES PATENTS

| | | |
|---|---|---|
| 2,654,842 | Englemann | Oct. 6, 1953 |
| 2,734,170 | Englemann et al. | Feb. 7, 1956 |
| 2,735,015 | Hirsch et al. | Feb. 14, 1956 |
| 2,859,417 | Arditi | Nov. 4, 1958 |

OTHER REFERENCES

Publication I: Experimental Determination of the Properties of Microstrip Components by Arditi Electrical Communication, Dec. 1953, pp. 283–293.